(12) United States Patent
Pan et al.

(10) Patent No.: US 10,665,690 B2
(45) Date of Patent: May 26, 2020

(54) GATE-CONTROLLED BIPOLAR JUNCTION TRANSISTOR AND OPERATION METHOD THEREOF

(71) Applicant: UNITED MICROELECTRONICS CORP., Hsin-Chu (TW)

(72) Inventors: Chen-Wei Pan, Hsinchu County (TW); Sheng Cho, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/163,551

(22) Filed: Oct. 17, 2018

(65) Prior Publication Data

US 2020/0105900 A1 Apr. 2, 2020

(30) Foreign Application Priority Data

Oct. 1, 2018 (TW) .............................. 107134577 A (51) Int. Cl.

| H01L 29/66 | (2006.01) |
|---|---|
| H01L 29/06 | (2006.01) |
| H01L 29/735 | (2006.01) |
| H01L 29/08 | (2006.01) |
| H01L 29/10 | (2006.01) |
| H01L 29/417 | (2006.01) |

(52) U.S. Cl.
CPC ...... *H01L 29/6625* (2013.01); *H01L 29/0649* (2013.01); *H01L 29/0808* (2013.01); *H01L 29/0821* (2013.01); *H01L 29/1004* (2013.01); *H01L 29/41708* (2013.01); *H01L 29/66265* (2013.01); *H01L 29/735* (2013.01)

(58) Field of Classification Search
CPC .............. H01L 29/735; H01L 29/0821; H01L 29/6625; H01L 27/0623
USPC .......................... 257/565, E29.174, 197, 575
See application file for complete search history.

(56) References Cited

U.S. PATENT DOCUMENTS

| 7,897,995 B2* | 3/2011 | Yang ................... H01L 29/0692 257/133 |
|---|---|---|
| 8,373,229 B2 | 2/2013 | Chen |
| 8,610,241 B1 | 12/2013 | Hu |
| 9,035,426 B2 | 5/2015 | Chang |
| 2013/0092939 A1* | 4/2013 | Kim .................. H01L 29/66272 257/51 |
| 2015/0179754 A1* | 6/2015 | Hung .................. H01L 29/6625 438/309 |
| 2016/0071962 A1* | 3/2016 | Senapati ............... H01L 29/735 257/48 |

(Continued)

*Primary Examiner* — Jonathan Han
(74) *Attorney, Agent, or Firm* — Winston Hsu (57) ABSTRACT

A gate-controlled bipolar junction transistor includes a substrate, an emitter region, a base region disposed on one side of the emitter region, and a collector region disposed on one side of the base region and being opposite to the emitter region. The emitter region includes first fin structures, first metal gates extending across the first fin structures, and an emitter contact plug on the first fin structures. A gate contact region is disposed between the emitter region and the base region. Each of the first metal gates includes an extended contact end portion protruding toward the base region. The extended contact end portion is disposed within the gate contact region. A gate contact is disposed on the extended contact end portion.

12 Claims, 6 Drawing Sheets

(56) References Cited

U.S. PATENT DOCUMENTS

2016/0358822 A1    12/2016  Hu
2018/0068998 A1*   3/2018  Wang ................ H01L 27/0207

* cited by examiner

GATE-CONTROLLED BIPOLAR JUNCTION TRANSISTOR AND OPERATION METHOD THEREOF

CROSS REFERENCE TO RELATED APPLICATION

This application claims the benefit of Taiwan patent application No. 107134577, filed on Oct. 1, 2018, the disclosure of which is incorporated herein in its entirety by reference.

BACKGROUND OF THE INVENTION

1. Field of the Invention

The present invention relates to the field of semiconductor technology, and more particularly to a gate-controlled bipolar junction transistor (BJT) and a method of operating the same.

2. Description of the Prior Art

In recent years, as various kinds of consumer electronic products are being constantly modified towards increased miniaturization, the size of semiconductor components are modified to be reduced accordingly, in order to meet high integration, high performance, low power consumption, and the demand of products. However, with the increasing miniaturization of electronic products, current planar field effect transistors (FETs) no longer meet the requirements of the products. Thus, there is a development for non-planar FETs such as Fin-FETs to achieve a high drive current and to lessen the short channel effect.

However, integrated circuit (IC) devices including complementary metal oxide semiconductor CMOS FinFETs also require other semiconductor structures and transistors, such as diodes and bipolar junction transistors (BJTs). These other semiconductor structures and transistors are formed alongside and concurrently with the FinFETs using the same materials and processes preferably. Because the FinFET basically has a three-dimensional structure, the forming method thereof is more complicated than that of the traditional structure, and it is difficult to integrate FinFET forming method into conventional planar FET forming method and the method of forming other semiconductor structures and transistors.

As known in the art, BJTs are manufactured in two types, NPN and PNP, and are available as individual, discrete components, or fabricated in integrated circuits such as signal amplifiers, digital circuits, or switch circuits. For example, PNP BJTs are mainstream adopted by the semiconductor industry, which are typically used in Band Gap Reference (BGR) circuits in a chip. However, the conventional PNP BJTs suffer from low beta (current gain) issue. It is desired to provide an improved BJT structure with enhanced beta/current gain and reduced device area.

SUMMARY OF THE INVENTION

The present invention provides an improved bipolar junction transistor and an operation method thereof to address the deficiencies and shortcomings of the prior art described above.

According to one aspect of the invention, provided is a gate-controlled bipolar junction transistor including a substrate; an emitter region disposed on the substrate, comprising a plurality of first fins structures extending along a first direction, at least two first metal gates extending across the plurality of first fin structures along a second direction, and an emitter contact plug on the plurality of first fin structures elongating along the second direction between the at least two first metal gates; a base region disposed on one side of the emitter region; a gate contact region disposed between the emitter region and the base region, wherein the each of the at least two first metal gates comprises an extended contact end portion protruding toward the base region and being disposed within the gate contact region; a gate contact plug disposed on the extended contact end portion; and a collector region disposed on one side of the base region and being opposite to the emitter region.

According to another aspect of the invention, provided is a method for operating a gate-controlled bipolar junction transistor. First, the aforesaid gate-controlled bipolar junction transistor is provided. The plurality of first fins in the emitter region is biased to an emitter voltage. The at least two first metal gates in the emitter region is biased to a gate voltage via the gate contact region and the gate contact plug. The base region is biased to a base voltage. The collector region is biased to a collector voltage.

According to an embodiment, the gate-controlled bipolar junction transistor is a PNP bipolar junction transistor, and the gate voltage is a negative voltage.

According to an embodiment, the gate-controlled bipolar junction transistor is an NPN bipolar junction transistor, and the gate voltage is a positive voltage.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention. Therefore, the following detailed description is not to be considered as limiting, but the embodiments included herein are defined by the scope of the accompanying claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The present invention relates to a bipolar junction transistor (BJT) fabricated in an integrated circuit. The integrated circuit includes, but is not limited to, a signal amplifier, a digital circuit or a switching circuit. According to an embodiment of the invention, the described BJT may be an NPN BJT and may be integrated into an integrated circuit die circuit. However, it should be understood that the present invention is applicable to PNP BJT. It will be appreciated that although some conductivity types have been used for illustrative purposes, the invention may be practiced with opposite conductivity types.

Figure 1:
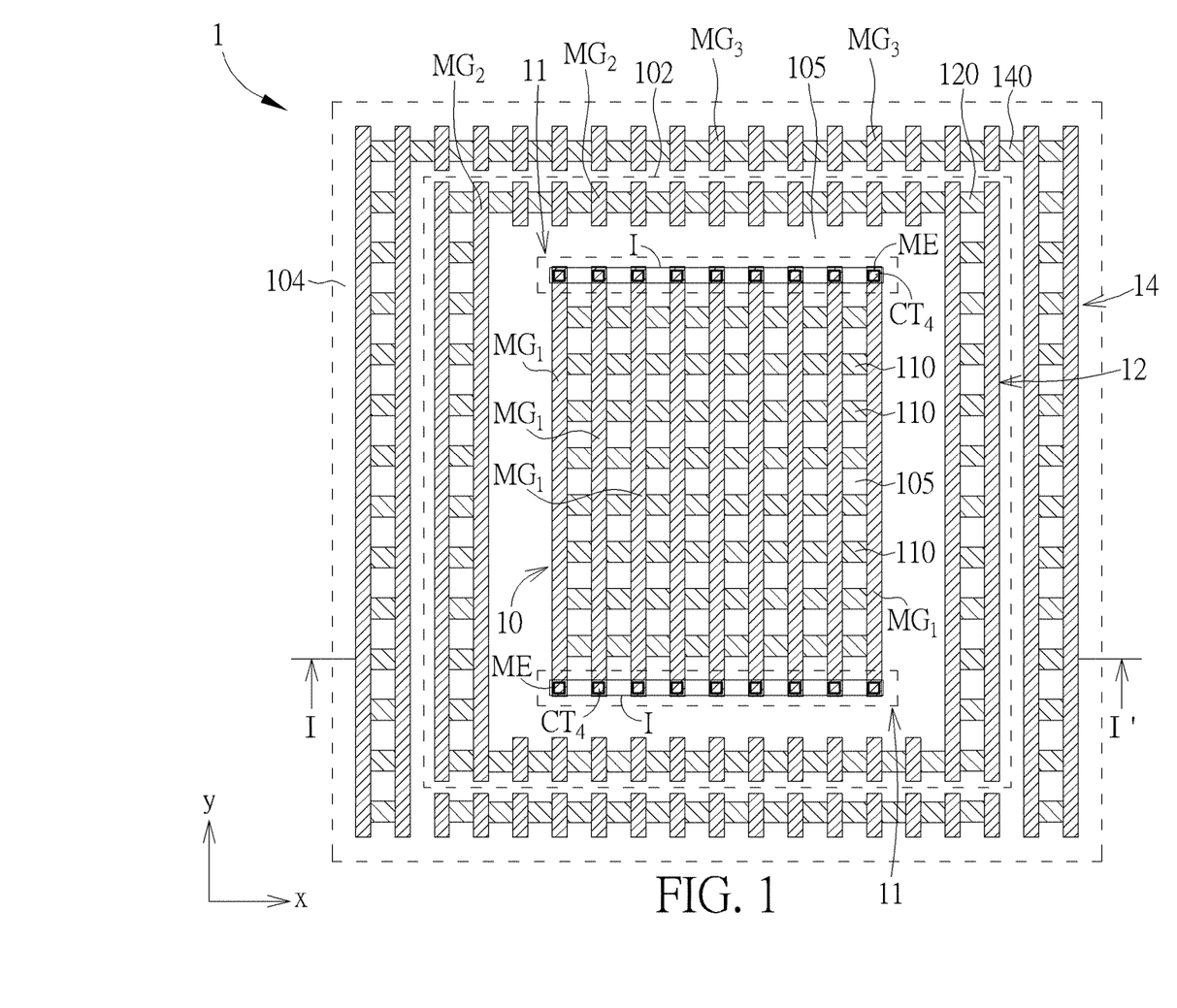
FIG. 1 is a schematic layout diagram of a bipolar junction transistor according to an embodiment of the invention.
Figure 2:
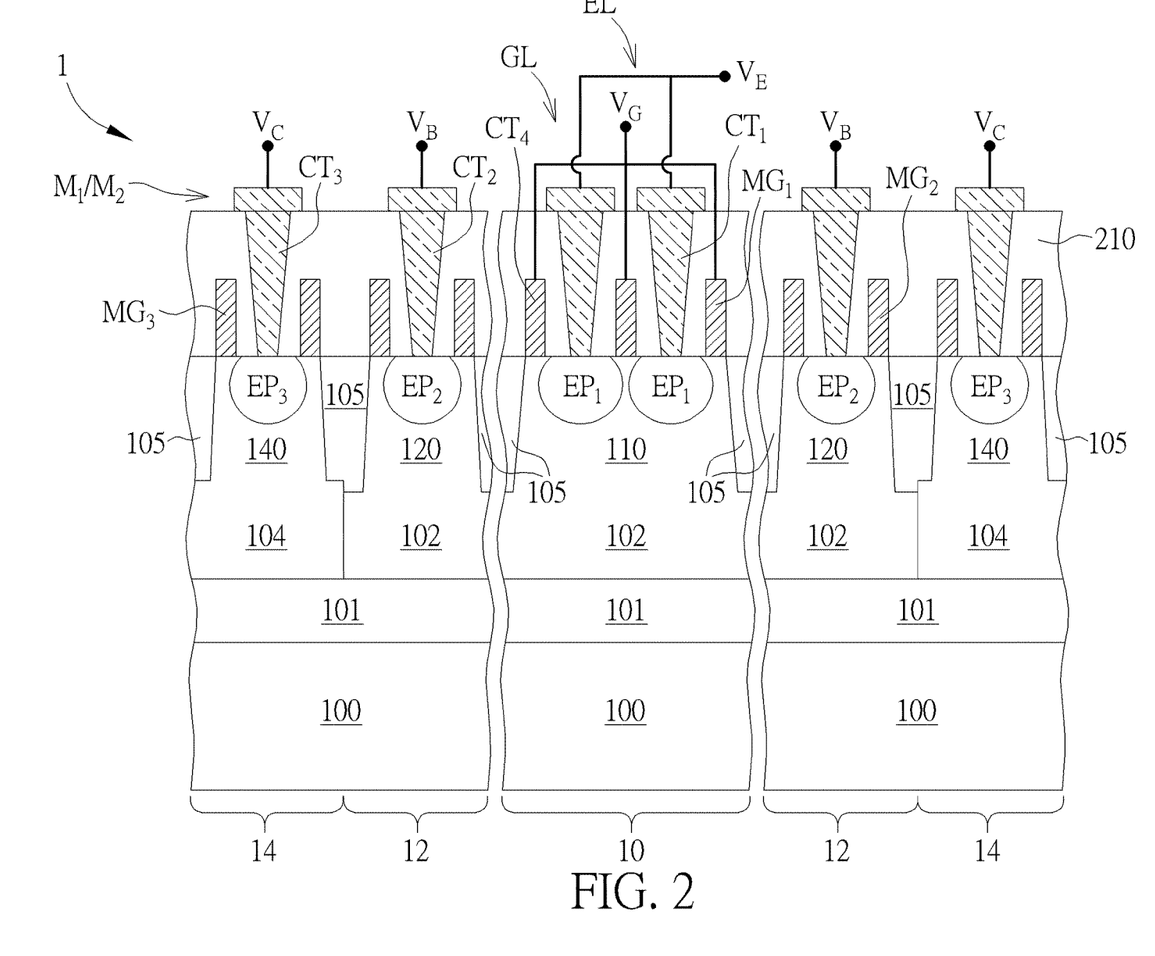
FIG. 2 is a cross-sectional view taken along line I-I' in FIG. 1.

Please refer to FIG. 1 and FIG. 2. FIG. 1 is a schematic layout diagram of a bipolar junction transistor 1 according to an embodiment of the invention. FIG. 2 is a cross-sectional view taken along line I-I' in FIG. 1. As shown in FIG. 1, the bipolar junction transistor 1 is a gate-controlled bipolar junction transistor, which includes a substrate 100, such as a semiconductor substrate or a silicon substrate, but not limited thereto. According to an embodiment of the invention, the substrate 100 has a first conductivity type, such as P-type. It should be understood that although the NPN type bipolar junction transistor is taken as an example in the embodiment, those skilled in the art should be able to apply the direct or indirect conversion of the disclosed embodiment to the PNP type bipolar Junction transistors.

According to an embodiment of the invention, an emitter region 10 is disposed on the substrate 100, which includes a plurality of first fin structures 110 extending along a first direction (e.g., a reference x-axis direction). In accordance with an embodiment of the invention, the plurality of first fin structures 110 are insulated from each other by a shallow trench isolation (STI) structure 105. The plurality of first fin structures 110 are portions protruding from of the upper surface of the STI structure 105. The bipolar junction transistor 1 further comprises an annular base region 12 on the substrate 100 and surrounding the emitter region 10. The base region 12 comprises at least one second fin structure 120 extending along the first direction. The bipolar junction transistor 1 further comprises an annular collector region 14 on the substrate 100 and surrounding the base region 12. The collector region 14 comprises at least a third fin structure 140 extending along the first direction.

According to an embodiment of the invention, the substrate 100 is provided with a first ion well 102 having a first conductivity type. For example, the first ion well 102 is a P-type well, wherein the emitter region 10 and the base region 12 are both disposed in the first ion well 102. According to an embodiment of the invention, the collector region 14 is disposed in a second ion well 104, wherein the second ion well 104 surrounds the first ion well 102 and has a second conductivity type, for example, the second ion well 104 is an N-type well.

According to an embodiment of the invention, the bipolar junction transistor 1 further comprises a deep ion well 101 having the second conductivity type. For example, the deep ion well 101 is a deep N-type well and is disposed below the first ion well 102 and the second ion well 104. The second ion well 104 and the deep ion well 101 together surround the first ion well 102 to electrically isolate the first ion well 102 from the substrate 100.

According to an embodiment of the invention, the emitter region 10 further comprises a plurality of first metal gates $MG_1$ striding across the first fin structures 110 in a second direction (e.g., the reference y-axis direction). It should be understood that the number of metal gates shown in the figures is merely illustrative. According to an embodiment of the invention, the first direction is orthogonal to the second direction. In accordance with an embodiment of the invention, the first metal gates $MG_1$ have approximately the same gap therebetween, for example, a gap of between 0.1 and 0.2 µm.

According to an embodiment of the present invention, as shown in FIG. 1, a plurality of second metal gates $MG_2$ extending in the second direction is disposed in the annular base region 12. The second metal gates $MG_2$ have approximately the same gap between them, for example, a gap of 0.1 to 0.2 µm. A plurality of third metal gates $MG_3$ extending along the second direction is disposed in the annular collector region 14. The third metal gates $MG_3$ have approximately the same gap between them, for example, a gap of 0.1 to 0.2 µm.

According to an embodiment of the invention, the first metal gates $MG_1$ are aligned with the second metal gates $MG_2$ respectively along the second direction, and the third metal gates $MG_3$ are aligned with the second metal gates $MG_2$ respectively along the second direction. The second metal gates $MG_2$ are not in direct contact with the first metal gates $MG_1$, and the third metal gate $MG_3$ are not in direct contact with the second metal gates $MG_2$. According to an embodiment of the present invention, as shown in FIG. 2, the bipolar junction transistor 1 further comprises at least one interlayer dielectric layer 210, such as a silicon oxide layer, disposed around the first metal gates $MG_1$, the second metal gates $MG_2$ and the third metal gate $MG_3$ and the interlayer dielectric layer 210 covers the first metal gates $MG_1$, the second metal gates $MG_2$, and the third metal gates $MG_3$.

According to an embodiment of the present invention, as shown in FIG. 2, a first epitaxial layer $EP_1$ is disposed between the first metal gates $MG_1$, for example, an $N^+$ doped SiP epitaxial layer (in an embodiment of PNPBJT, $P^+$ doped SiGe epitaxial layer). A second epitaxial layer $EP_2$ is disposed between the second metal gates $MG_2$, for example, a $P^+$ doped SiGe epitaxial layer (in an embodiment of a PNPBJT, $N^+$ doped SiP epitaxial layer). A third epitaxial layer $EP_3$ is disposed between the third metal gates $MG_3$, for example, an $N^+$ doped SiP epitaxial layer (in an embodiment of PNPBJT, $P^+$ doped SiGe epitaxial layer).

According to an embodiment of the invention, the first epitaxial layer $EP_1$ can be contacted through a first contact plug $CT_1$ (emitter contact plug) to provide the first epitaxial layer $EP_1$ with an emitter voltage $V_E$ during device operation. According to an embodiment of the invention, the second epitaxial layer $EP_2$ can be contacted through a second contact plug $CT_2$ (base contact plug) to provide the second epitaxial layer $EP_2$ with a base voltage $V_B$ during device operation. According to an embodiment of the invention, the third epitaxial layer $EP_3$ can be contacted through a third contact plug $CT_3$ (collector contact plug) to provide the third epitaxial layer $EP_3$ with a collector voltage $V_C$ during device operation.

According to an embodiment of the invention, the contact plugs $CT_1$~$CT_3$ may be cylindrical plugs or slot contact plugs extending in the second direction across the plurality of fin structures 110. The contact plugs $CT_1$~$CT_3$ may be composed of a $M_0$ metal layer, and may include, for example, a TiN barrier layer and a tungsten layer, but not limited thereto. Subsequent layers of metal layers such as $M_1$ and $M_2$, or other interconnect structures can be utilized to form circuit signal paths.

As shown in FIG. 2, the first contact plug $CT_1$ (emitter contact plug) is electrically connected to an emitter line EL located above the emitter region 10. The emitter voltage $V_E$ can be supplied to the first epitaxial layer $EP_1$ in the emitter region 10 via the emitter line EL and the first contact plug $CT_1$ (emitter contact plug) during device operation.

According to an embodiment of the invention, as shown in FIG. 1, between the emitter region 10 and the base region 12, the bipolar junction transistor 1 further comprises a gate contact region 11. Each of the first metal gates $MG_1$ includes an extended contact end portion ME protruding toward the base region 12 such that the extended contact end portion ME is located within the gate contact region 11. A fourth contact plug $CT_4$ (gate contact plug) is provided on each of the extended contact end portions ME. According to an embodiment of the invention, a gate contact region 11 is disposed at both ends of each of the first metal gates $MG_1$. According to an embodiment of the invention, the first metal gates $MG_1$ may be electrically connected together by interconnect I that extends along the first direction, and the fourth contact plugs $CT_4$ (gate contact plugs) are electrically connected to the interconnect I. For example, the interconnect I may be formed in the $M_1$ metal layer, but not limited thereto.

Figure 3:
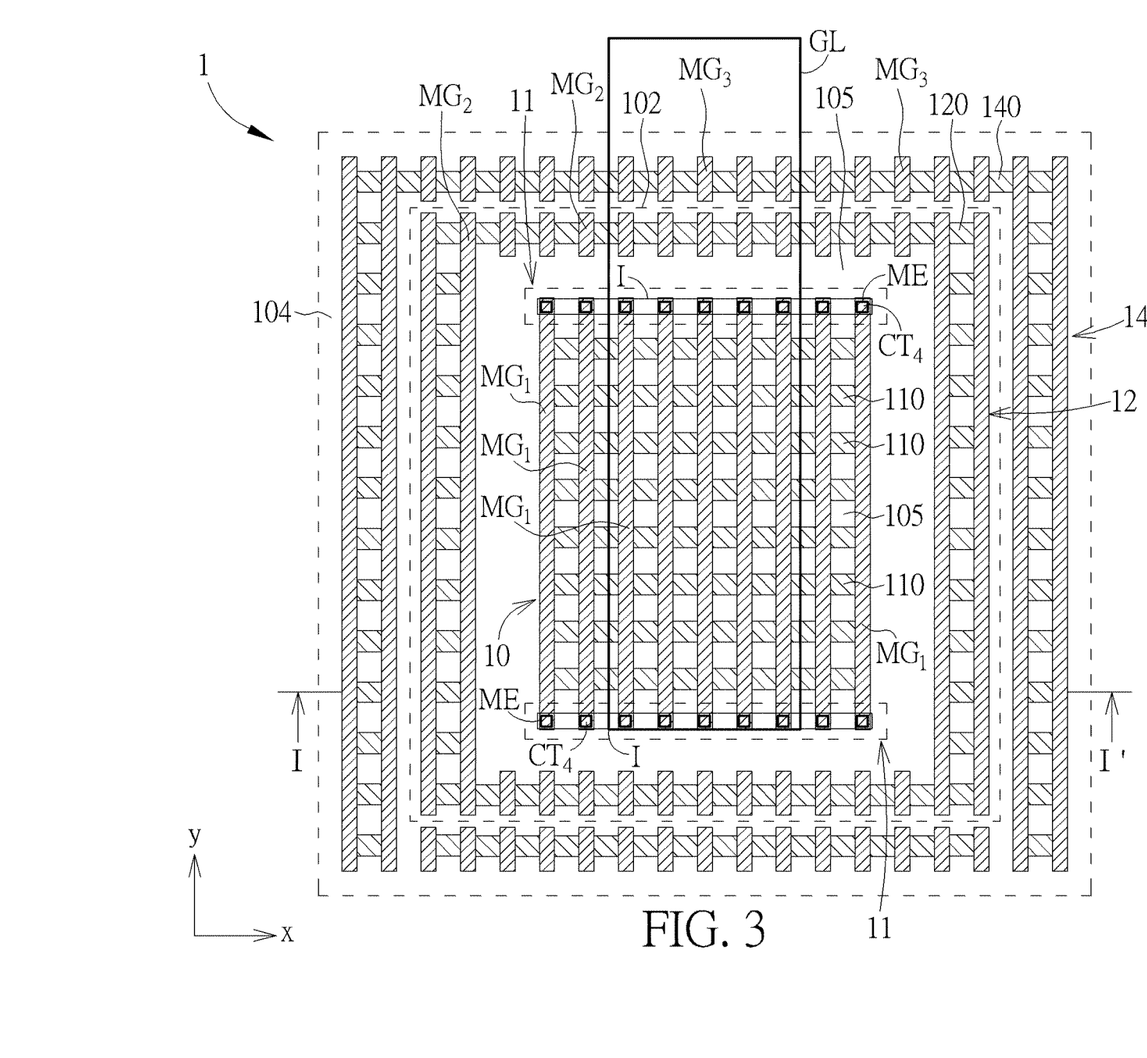
FIG. 3 schematically shows the gate contact plugs are electrically connected to the gate line above the gate contact region.

As shown in FIG. 3, in accordance with an embodiment of the present invention, the fourth contact plugs $CT_4$ (gate contact plugs) may be electrically connected to a gate line GL above the gate contact region 11. During the device operation, a negative gate voltage or a positive gate voltage may be applied to the first metal gates $MG_1$ through the gate line GL and the fourth contact plugs $CT_4$ (gate contact plug) in the gate contact region 11. According to an embodiment of the invention, the gate line GL and the emitter line EL are disposed in different layers of a metal interconnection scheme on the substrate 100. For example, the gate line GL may be provided in the $M_4$ metal layer, and the emitter line EL may be provided in the $M_2$ or $M_3$ metal layer, but not limited thereto. According to an embodiment of the invention, the gate line GL may be electrically connected with the interconnect line I through via plugs.

The method for operating the bipolar junction transistor of the present invention comprises at least the steps of: biasing the first fin structures 110 to the emitter voltage $V_E$; biasing the first metal gates $MG_1$ in the emitter region 10 to a gate voltage VG via the gate contact region 11 and the fourth contact plugs $CT_4$ (gate contact plugs); biasing the second fin structure 120 in the base region 12 to a base voltage $V_B$; and biasing the collector region 14 to a collector voltage $V_C$. If the bipolar junction transistor 1 is a PNP bipolar junction transistor, the gate voltage $V_G$ is a negative voltage, for example, the gate voltage $V_G$ may range between about −0.6V and about −2.0V. If the bipolar junction transistor 1 is an NPN bipolar junction transistor, the gate voltage $V_G$ is a positive voltage, for example, the gate voltage $V_G$ may range between about 0.6V and about 2.0V.

According to an embodiment of the invention, taking the NPN bipolar junction transistor as an example, the base has a bias voltage ($V_{BE}$) of about 0V to −1.2V with respect to the emitter and the collector has a bias voltage ($V_{CB}$) of about 0V to −5V with respect to the base during operation. According to an embodiment of the invention, taking a PNP bipolar junction transistor as an example, the base has a bias voltage ($V_{BE}$) of about 0V to 1.2V with respect to the emitter and the collector has a bias voltage ($V_{CB}$) of about 0V to 5V with respect to the base during operation.

Figure 4:
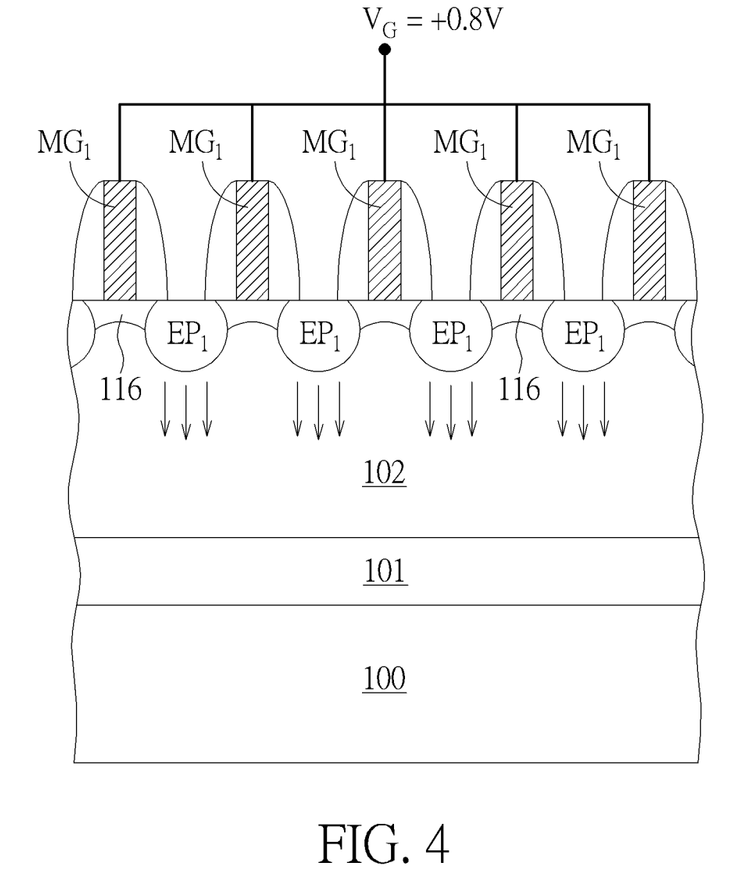
FIG. 4 schematically shows an example of NPN bipolar junction transistor, wherein a positive voltage is applied to the first metal gate during operation, and a depletion region is formed directly under the first metal gate.

As shown in FIG. 4, taking an NPN bipolar junction transistor as an example, a positive voltage is applied to the first metal gate $MG_1$ during operation, for example, the gate voltage $V_G$ may range between about 0.6V and about 2.0V. A depletion region 116 may be formed directly under the first metal gates $MG_1$ between the first epitaxial layers $EP_1$, so that the current path is concentrated directly below the first epitaxial layer $EP_1$, thereby reducing the recombination current. According to the experimental results, taking the NPN bipolar junction transistor as an example, by applying a positive voltage of 0.8V to the first metal gates $MG_1$ during operation, the β value (β=$I_C$/$I_B$) is increased by about 13% (comparing to the case where the first metal gates $MG_1$ are electrically floating). Taking a PNP bipolar junction transistor as an example, by applying a negative voltage of −0.8 V to the first metal gates $MG_1$ during operation, the β value is increased by about 23% (comparing to the case where the first metal gates $MG_1$ are electrically floating).

Figure 5:
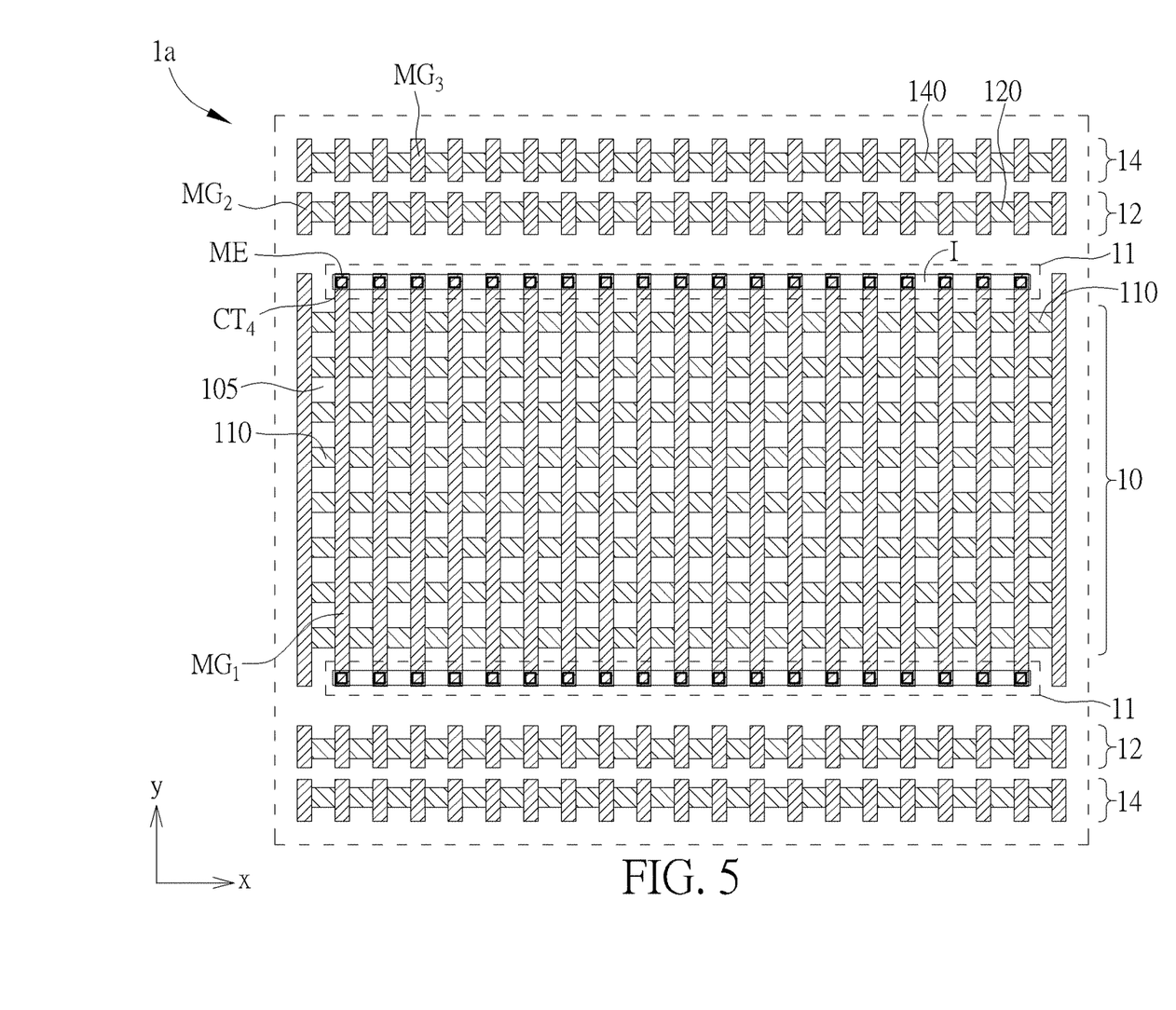
FIG. 5 is a schematic layout diagram of a bipolar junction transistor according to another embodiment of the present invention.

FIG. 5 is a schematic layout diagram of a bipolar junction transistor 1a according to another embodiment of the present invention, wherein the same elements, regions or layers are still denoted by the same numeral numbers. As shown in FIG. 5, similarly, the bipolar junction transistor 1a comprises an emitter region 10 having a plurality of first fin structures 110 extending in a first direction (e.g., the reference x-axis direction). In accordance with an embodiment of the invention, the first fin structures 110 are insulated from each other by a shallow trench isolation structure 105. The first fin structures 110 protrude from the upper surface of the shallow trench isolation structure 105. The bipolar junction transistor 1a further comprises a base region 12 on one side of the emitter region 10. The base region 12 comprises at least one second fin structure 120 extending along the first direction. The bipolar junction transistor 1a further comprises a collector region 14 disposed on the other side of the base region 12 opposite to the emitter region 10. The collector region 14 comprises at least a third fin structure 140 extending along the first direction.

According to an embodiment of the invention, the emitter region 10 further comprises a plurality of first metal gates $MG_1$ striding across the first fin structures 110 in a second direction (e.g., the reference y-axis direction). It should be understood that the number of metal gates shown in the figures is merely illustrative. According to an embodiment of the invention, the first direction is orthogonal to the second direction. In accordance with an embodiment of the invention, the first metal gates $MG_1$ have approximately the same gap therebetween, for example, a gap of between 0.1 and 0.2 μm.

Between the emitter region 10 and the base region 12, the bipolar junction transistor 1a also comprises a gate contact region 11. Each of the first metal gates MG$_1$ comprises an extended contact end portion ME protruding toward the base region 12 such that the extended contact end portion ME is located within the gate contact region 11. A fourth contact plug CT$_4$ (gate contact plug) is provided on each of the extended contact end portions ME. According to an embodiment of the invention, a gate contact region 11 is disposed at both ends of the first metal gate MG$_1$. According to an embodiment of the invention, the first metal gates MG$_1$ may be electrically connected together by interconnect I that extends along the first direction and the fourth contact plugs CT$_4$ (gate contact plugs) are electrically connected to the interconnect I. For example, the interconnect I may be formed in the M1 metal layer, but is not limited thereto.

Figure 6:
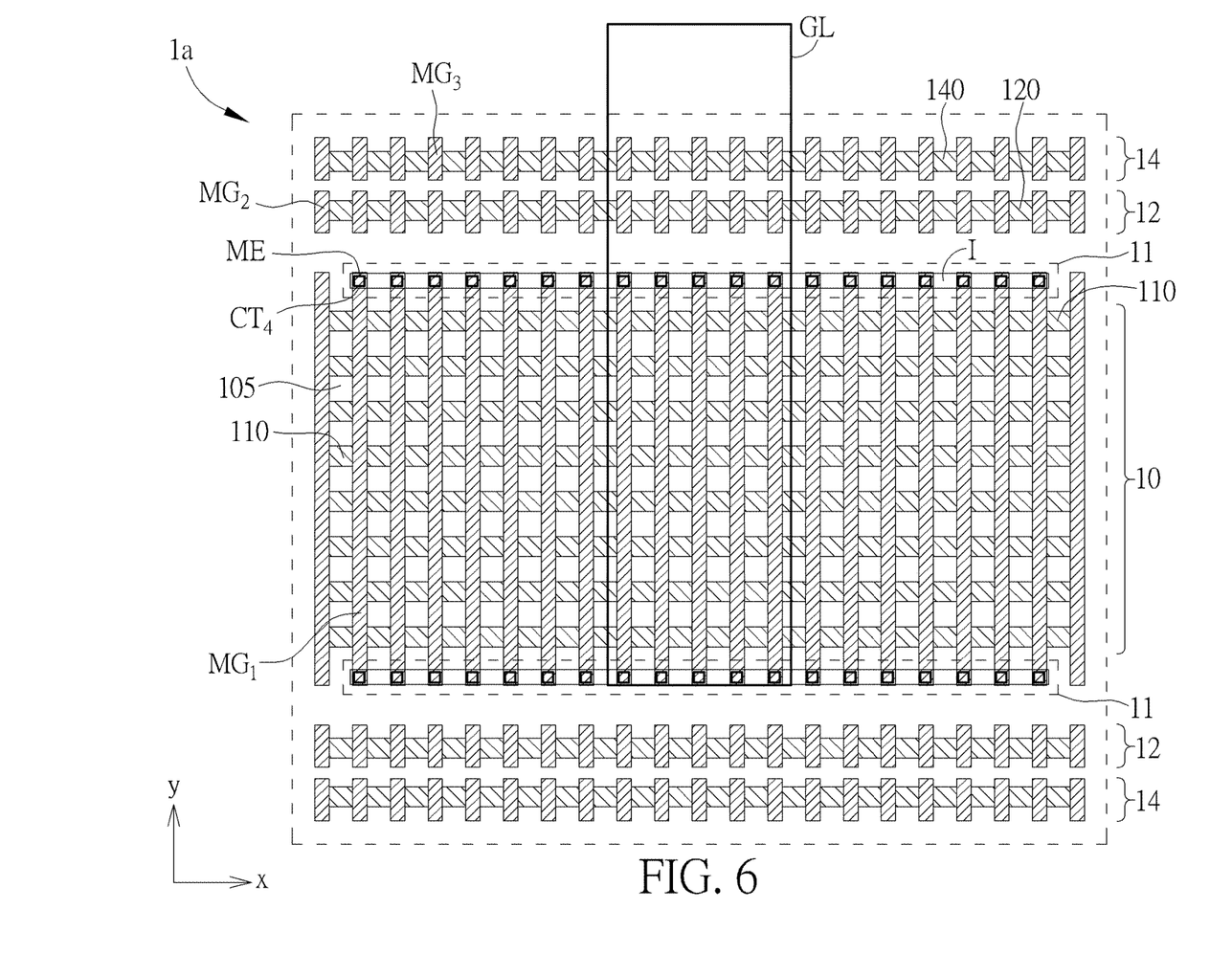
FIG. 6 illustrates that the gate contact plugs are electrically connected to the gate line above the gate contact area.

As shown in FIG. 6, in accordance with an embodiment of the present invention, the fourth contact plug CT$_4$ (gate contact plugs) are electrically connected to a gate line GL above the gate contact region 11. During the operation of the device, a negative gate voltage or a positive gate voltage is applied to the first metal gates MG$_1$ through the gate line GL and the fourth contact plugs CT$_4$ (gate contact plugs) in the gate contact region 11. According to an embodiment of the invention, the gate line GL and the emitter line EL are disposed in different layers of a metal interconnection scheme. For example, the gate line GL is formed in the M$_4$ metal layer, and the emitter line EL is formed in the M$_2$ or M$_3$ metal layer, but is not limited thereto. According to an embodiment of the invention, the gate line GL may be electrically connected to the interconnect I through via plugs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A gate-controlled bipolar junction transistor, comprising:
   a substrate;
   an emitter region disposed on the substrate, the emitter region comprising a plurality of first fins structures extending along a first direction, at least two first metal gates extending across the plurality of first fin structures along a second direction, and an emitter contact plug on the plurality of first fin structures elongating along the second direction between the at least two first metal gates;
   a base region disposed on one side of the emitter region;
   a gate contact region disposed between the emitter region and the base region, wherein the each of the at least two first metal gates comprises an extended contact end portion protruding toward the base region and being disposed within the gate contact region;
   a gate contact plug disposed on the extended contact end portion; and
   a collector region disposed on one side of the base region and being opposite to the emitter region, wherein the collector region is annular and comprising at least one third fin structure extending along the first direction, and height of the at least one third fin structure in the collector region is less than height of one of the first fin structures in the emitter region.

2. The gate-controlled bipolar junction transistor according to claim 1, wherein the emitter contact plug is electrically connected to an emitter line overlying the emitter region.

3. The gate-controlled bipolar junction transistor according to claim 2, wherein the gate contact plug is electrically connected to a gate line overlying the gate contact region.

4. The gate-controlled bipolar junction transistor according to claim 3, wherein in operation a negative gate voltage or a positive gate voltage is applied to the at least two first metal gates via the gate line and the gate contact region.

5. The gate-controlled bipolar junction transistor according to claim 3, wherein the gate line and the emitter line are disposed in different levels of a metal interconnection scheme on the substrate.

6. The gate-controlled bipolar junction transistor according to claim 1, wherein the base region comprising at least one second fin structure extending along the first direction, at least two second metal gates extending across the at least one second fin structure along the second direction, and a base contact plug on the at least one second fin structure between the at least two second metal gates.

7. The gate-controlled bipolar junction transistor according to claim 6, wherein the at least two first metal gates are aligned with the at least two second metal gates, respectively, along the second direction.

8. The gate-controlled bipolar junction transistor according to claim 6, wherein the at least two second metal gates are not in contact with the at least two first metal gates.

9. The gate-controlled bipolar junction transistor according to claim 1, wherein the substrate is a semiconductor substrate of a first conductivity type, a first ion well of the first conductivity type is provided in the substrate, wherein the emitter region and the base region are disposed in the first ion well.

10. The gate-controlled bipolar junction transistor according to claim 9, wherein the collector region is disposed in a second ion well of a second conductivity type surrounding the first ion well.

11. A gate-controlled bipolar junction transistor, comprising:
    a substrate;
    an emitter region disposed on the substrate, the emitter region comprising a plurality of first fins structures extending along a first direction, at least two first metal gates extending across the plurality of first fin structures along a second direction, and an emitter contact plug on the plurality of first fin structures elongating along the second direction between the at least two first metal gates;
    a base region disposed on one side of the emitter region;
    a gate contact region disposed between the emitter region and the base region, wherein the each of the at least two first metal gates comprises an extended contact end portion protruding toward the base region and being disposed within the gate contact region;
    a gate contact plug disposed on the extended contact end portion; and
    a collector region disposed on one side of the base region and being opposite to the emitter region, wherein one side of the first metal gate is aligned with one side of the first fin structure without any overhang of the first metal gate.

12. A gate-controlled bipolar junction transistor, comprising:
    a substrate;
    an emitter region disposed on the substrate, the emitter region comprising a plurality of first fins structures extending along a first direction, at least two first metal gates extending across the plurality of first fin structures along a second direction, and an emitter contact plug on the plurality of first fin structures elongating along the second direction between the at least two first metal gates;

a base region disposed on one side of the emitter region;

a gate contact region disposed between the emitter region and the base region, wherein the each of the at least two first metal gates comprises an extended contact end portion protruding toward the base region and being disposed within the gate contact region;

a gate contact plug disposed on the extended contact end portion; and a collector region disposed on one side of the base region and being opposite to the emitter region, wherein the two first metal gates are connected together by an interconnect, the interconnect extends along the first direction, and the gate contact plug is electrically connected to the interconnect.

* * * * *